(12) United States Patent
Chou (10) Patent No.: US 8,927,919 B2
(45) Date of Patent: Jan. 6, 2015

(54) PHOTOELECTRIC SWITCH CAPABLE OF PREVENTING LIGHT LEAKAGE WITH A RIB UNIT COOPERATING WITH A TUBULAR WALL TO CONFINE A ROLLING CHAMBER

(76) Inventor: Tien-Ming Chou, Taichung (TW)

( * ) Notice: Subject to any disclaimer, the term of this patent is extended or adjusted under 35 U.S.C. 154(b) by 293 days.

(21) Appl. No.: 13/463,077

(22) Filed: May 3, 2012

(65) Prior Publication Data
US 2013/0292551 A1    Nov. 7, 2013

(51) Int. Cl.
*G01J 1/36*    (2006.01)

(52) U.S. Cl.
USPC ...................................... 250/227.22; 250/239

(58) Field of Classification Search
USPC ....................... 250/227.22, 221, 559.12, 239; 200/61.45, 61.52; 33/366.23, 366.24, 33/366.16
See application file for complete search history.

(56) References Cited

U.S. PATENT DOCUMENTS 5,202,559 A * 4/1993 Durst .......................... 250/231.1
6,690,457 B2 * 2/2004 Yamaguchi ................ 356/139.1

* cited by examiner

*Primary Examiner* — Que T Le
(74) *Attorney, Agent, or Firm* — The Webb Law Firm (57) ABSTRACT

A photoelectric switch includes a base having a tubular wall surrounding an axis, and a cover coupled to the base and including a rib unit that cooperates with the tubular wall to confine a rolling chamber. The rib unit has at least one portion overlapping the tubular wall. A light passage extends through the rolling chamber and two diametrically opposite sides of the tubular wall. A photoelectric unit is enclosed by the base and the cover, and includes a light emitter and a light receiver disposed respectively on two opposite ends of the light passage, and a rolling member disposed in the rolling chamber and movable between a blocking position to block the light passage and a non-blocking position to unblock the light passage.

12 Claims, 10 Drawing Sheets

PHOTOELECTRIC SWITCH CAPABLE OF PREVENTING LIGHT LEAKAGE WITH A RIB UNIT COOPERATING WITH A TUBULAR WALL TO CONFINE A ROLLING CHAMBER

BACKGROUND OF THE INVENTION

1. Field of the Invention

The invention relates to a photoelectric switch, and more particularly to a photoelectric switch that uses an angular change to control a switch status and a photoelectric switch housing thereof.

2. Description of the Related Art

Figure 1:
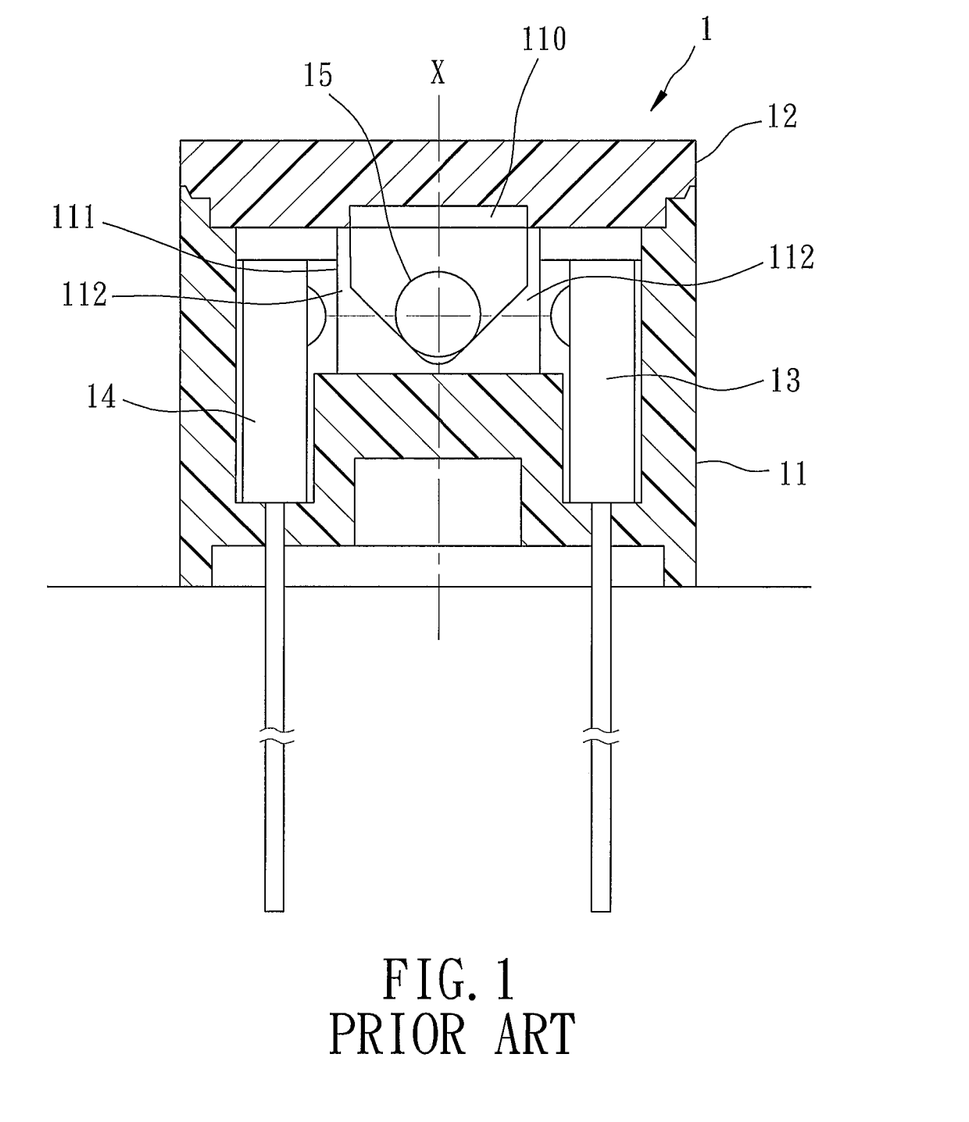
FIG. 1 is a sectional view of a conventional photoelectric switch.

Referring to FIG. 1, a conventional photoelectric switch 1 is shown to include a case 11 and a cover 12 coupled to each other, a light emitter 13 and a light receiver 14 mounted oppositely in the case 11, and a ball 15. The case 11 has a tubular wall 111 surrounding an X-axis and defining a rolling chamber 110, and two notches 112 formed in the tubular wall 111 and respectively corresponding in position to the light emitter 13 and the light receiver 14. Light emitted by the light emitter 13 is received by the light receiver 14 through the notches 112. The ball 15 is disposed in the rolling chamber 110.

Through this configuration, in the presence of an external force, the ball 15 is rollable between a non-blocking position that unblocks a light passage to place the switch 1 in an "ON" state, and a blocking position that blocks the light passage to shift the switch 1 to an "OFF" state. Hence, the ON/OFF control of the switch device 1 can be achieved.

Although the conventional photoelectric switch 1 uses the recesses 112 to restrict a light transmission range of the light emitter 13, since each recess 112 has one open end, scattering of light toward the cover 12 cannot be effectively restricted. Further, since a seam between the case 11 and the cover 12 is also within a scattering area of the light, not only will the communication be adversely affected by refraction of the scattered light, but also leaking of the light is likely to happen. Hence, the photoelectric switch 1 is prone to malfunction.

Figure 2:
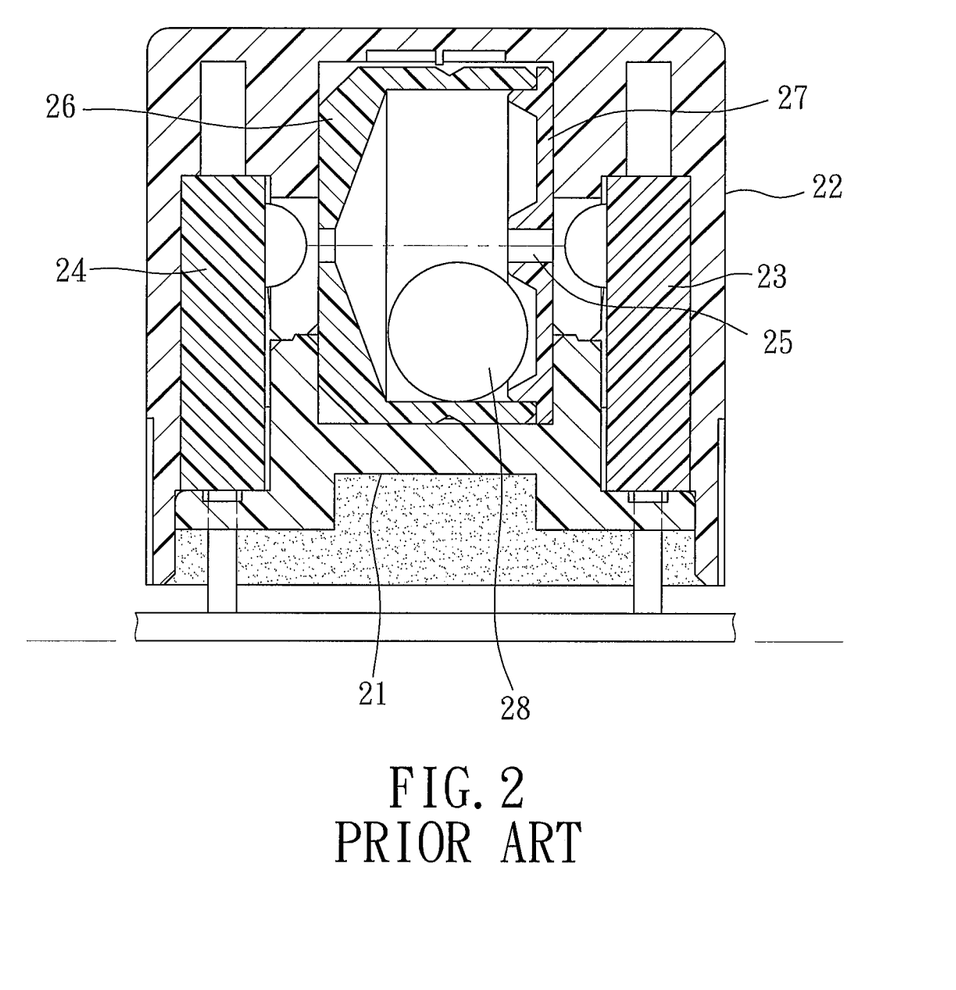
FIG. 2 is a sectional view of a conventional rolling-ball switch disclosed in Taiwanese Patent No. I310952.
Figure 3:
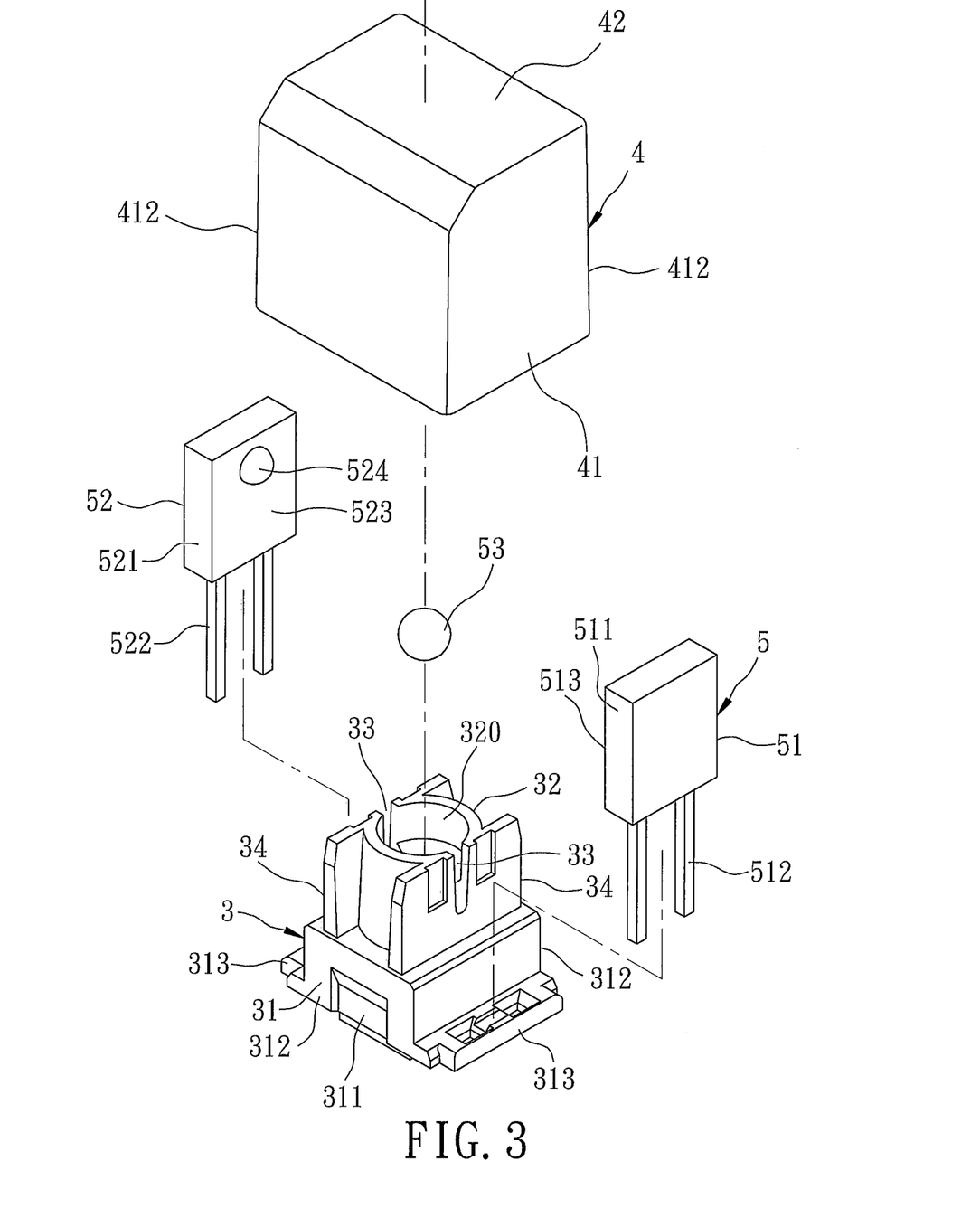
FIG. 3 is an exploded perspective view of a photoelectric switch according to the first preferred embodiment of the present invention.

Referring to FIG. 2, a conventional rolling-ball switch, as disclosed by the applicant in Taiwanese Patent No. I310952, mainly includes a base 21 and a cover body 22 coupled to each other, a light emitter 23 and a light receiver 24 mounted oppositely within the base 21 and the cover body 22, an inner tubular wall 26 and an inner cover 27 disposed between the light emitter 23 and the light receiver 24 and defining a light passage 25, and a ball 28 disposed in a space defined by the inner tubular wall 26 and the inner cover 27. Through this configuration, light can only travel along the light passage 25. Hence, the ON/OFF control of the switch can be achieved.

Although the aforesaid rolling-ball switch can achieve the purpose of restricting a light transmission range and light leakage, because of the additional two components, that is, the inner tubular wall 26 and the inner cover 27, assembling procedures and costs of the aforesaid conventional rolling-ball switch are increased.

SUMMARY OF THE INVENTION

Therefore, an object of the present invention is to provide a photoelectric switch that has enhanced light sensitivity and simple assembling procedures and a photoelectric switch housing thereof.

According to one aspect of this invention, a photoelectric switch comprises a base, a cover, a light passage, and a photoelectric unit. The base includes a tubular wall surrounding an axis. The cover is coupled to the base, and includes a rib unit that cooperates with the tubular wall to confine a rolling chamber. The rib unit has at least one portion overlapping the tubular wall. The light passage extends through the rolling chamber and two diametrically opposite sides of the tubular wall. The photoelectric unit is enclosed by the base and the cover, and includes a light emitter and a light receiver disposed respectively on two opposite ends of the light passage, and a rolling member disposed in the rolling chamber and movable between a blocking position to block the light passage and a non-blocking position to unblock the light passage.

According to another aspect of this invention, a photoelectric switch housing for mounting a photoelectric unit that emits and receives a light signal and that has a rolling member, the photoelectric switch housing comprises a base including a tubular wall surrounding an axis, a cover coupled to the base, and a light passage. The cover and the base are adapted to cooperatively enclose therebetween the photoelectric unit. The cover includes a rib unit that cooperates with the tubular wall to confine a rolling chamber for receiving the rolling member. The rib unit has at least one portion overlapping the tubular wall. The light passage extends through the rolling chamber and two diametrically opposite sides of the tubular wall. The light passage is adapted to permit transmission of the light signal, so that the rolling member is movable between a blocking position to block the light passage and a non-blocking position to unblock the light passage.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

The above-mentioned and other technical contents, features, and effects of this invention will be clearly presented from the following detailed description of four preferred embodiments in coordination with the reference drawings.

Before the present invention is described in greater detail, it should be noted that the same reference numerals have been used to denote like elements throughout the specification.

Referring to FIGS. 3 to 6, a photoelectric switch according to the first preferred embodiment of the present invention is shown to comprise a photoelectric switch housing and a photoelectric unit 5.

The photoelectric switch housing includes a base 3 and a cover 4. The base 3 includes a carrier 31, a tubular wall 32 formed on the carrier 31 and surrounding an X-axis, two first holes 33, and two wing plates 34. The carrier 31 has two opposite first lateral sides 312, and two opposite second lateral sides 313 transverse to the first lateral sides 312. Two engaging grooves 311 are formed respectively in the first lateral sides 312. The first holes 33 are formed respectively in two diametrically opposite sides of the tubular wall 32, and are indented axially and respectively in edges of the diametrically opposite sides of the tubular wall 32. The wing plates 34 project from the carrier 31 and are connected respectively to the two diametrically opposite sides of the tubular wall 32. Specifically, each of the wing plates 34 projects from the tubular wall 32 substantially along a line that is tangent to a respective one of the diametrically opposite sides of the tubular wall 32 at a respective one of the first holes 33.

Figure 4:
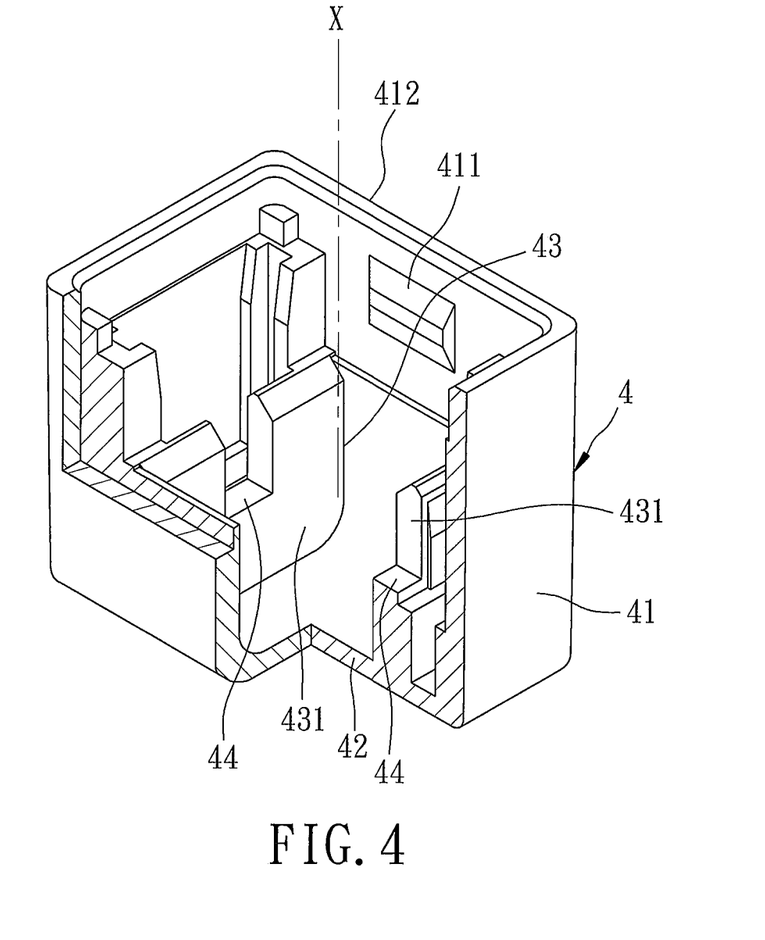
FIG. 4 is a perspective view of a cover of the first preferred embodiment with a portion thereof being cut away for the sake of clarity.

The cover 4 is coupled to the base 3, and includes a surrounding wall 41 surrounding the X-axis, an end wall 42 connected to and closing one end of the surrounding wall 41, a rib unit 43 formed on an inner surface of the end wall 42, and two second holes 44. The surrounding wall 41 has two protrusions 411 (only one is shown in FIG. 4) projecting inwardly and respectively from two opposite walls 412 thereof and engaged respectively to the engaging grooves 311. The rib unit 43 includes two spaced-apart rib plates 431 overlapping the two diametrically opposite sides of the tubular wall 32. The rib plates 431 cooperate with the tubular wall 32 to confine a rolling chamber 320. The second holes 44 are indented axially and respectively in edges of the rib plates 431, and are respectively aligned with the first holes 33 in a direction transverse to the X-axis. A light passage 40 extends through the aligned first and second holes 33, 44 and the rolling chamber 320.

The photoelectric unit 5 is enclosed by the base 3 and the cover 4, and includes a light emitter 51 and a light receiver 52 disposed respectively on two opposite ends of the light passage 40, and a rolling member 53 disposed in the rolling chamber 320. Each of the light emitter 51 and the light receiver 52 includes a main body 511, 521 disposed between the surrounding wall 41 and a corresponding one of the rib plates 431, a pair of terminals 512, 522 extending through a corresponding one of the second lateral sides 313 of the carrier 31, and a head 514, 524 projecting from one side 513, 523 of the main body 511, 521 into the light passage 40.

To assemble the base 3 and the cover 4, the main bodies 511, 521 of the light emitter 51 and the light receiver 52 are first disposed between the surrounding wall 41 and the corresponding rib plates 431, after which the cover 4 and the base 3 are coupled to each other. During this time, the rib plates 431 extend to the two diametrically opposite sides of the tubular wall 32 such that the rib plates 431, the wing plates 34, and the tubular wall 32 are connected to each other in an overlapping manner. Furthermore, the terminals 512, 522 of each of the light emitter 51 and the light receiver 52 extend through the corresponding second lateral side 313 of the carrier 31 such that the main body 511, 521 of each of the light emitter 51 and the light receiver 52 is sandwiched between the carrier 31 and the cover 4. Finally, the protrusions 411 of the cover 4 are engaged to the respective engaging grooves 311 in the carrier 31, thereby completing the assembly.

Figure 5:
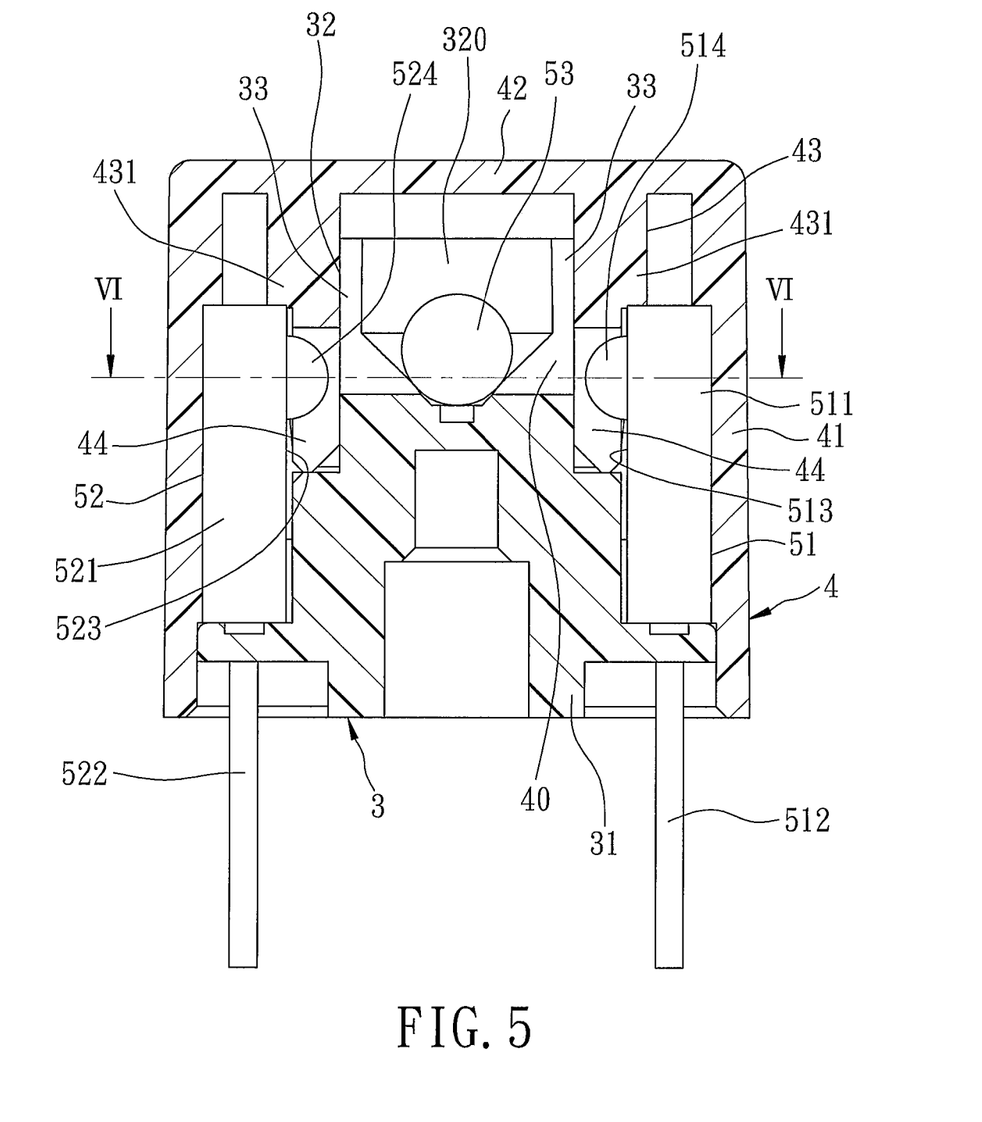
FIG. 5 is a sectional view of the first preferred embodiment in an assembled state.
Figure 6:
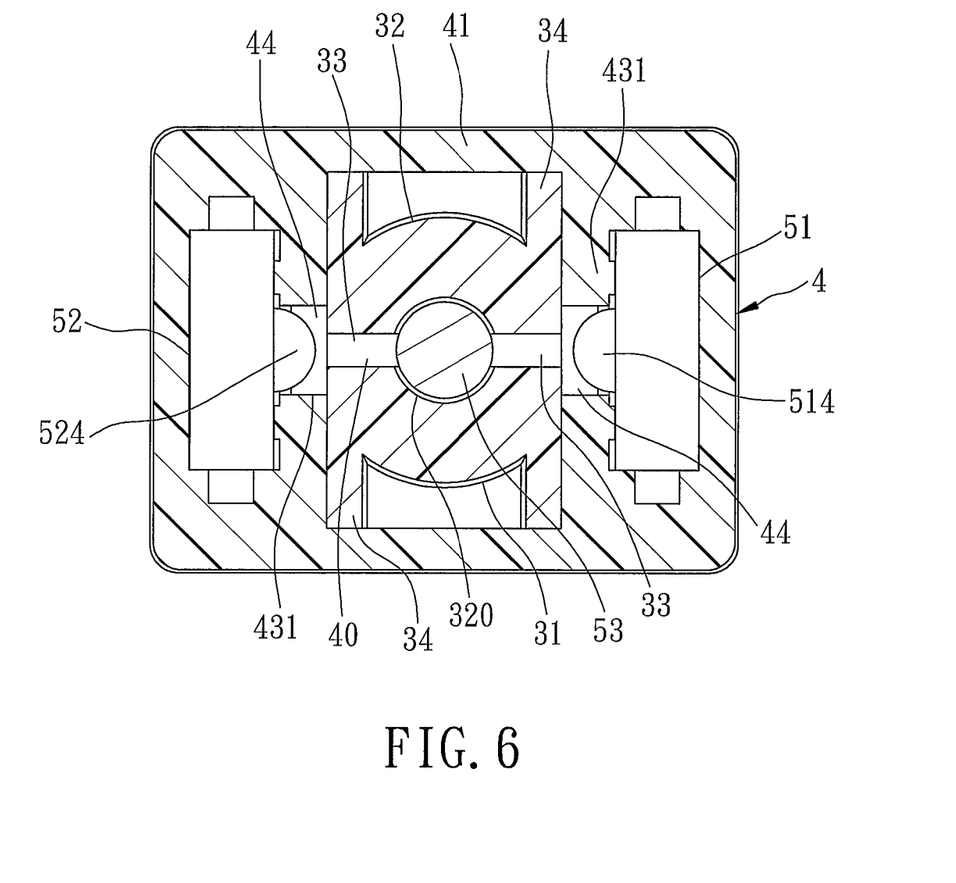
FIG. 6 is a sectional view of the first preferred embodiment taken along line VI-VI of FIG. 5.

With reference to FIGS. 5 and 6, because of the overlapping relationship between the rib plates 431, the wing plates 34, and the tubular wall 32 and because the first and second holes 33, 44 are aligned to each other, light emitted by the light emitter 51 is restricted to travel within the light passage 40, and the rolling member 53 is movable in the rolling chamber 320 between a blocking position and a non-blocking position. In the blocking position, the rolling member 53 blocks the light passage 40, so that light emitted by the light emitter 51 is not received by the light receiver 52, thereby placing the photoelectric switch in, for example, an OFF state. In the unblocking position, the rolling member 53 unblocks the light passage 40, so that light emitted by the light emitter 51 is received by the light receiver 52, thereby placing the photoelectric switch in, for example, an ON state. Hence, through the movement of the rolling member 43 between the block and unblock positions, operation of the photoelectric switch of this invention can be controlled.

Figure 7:
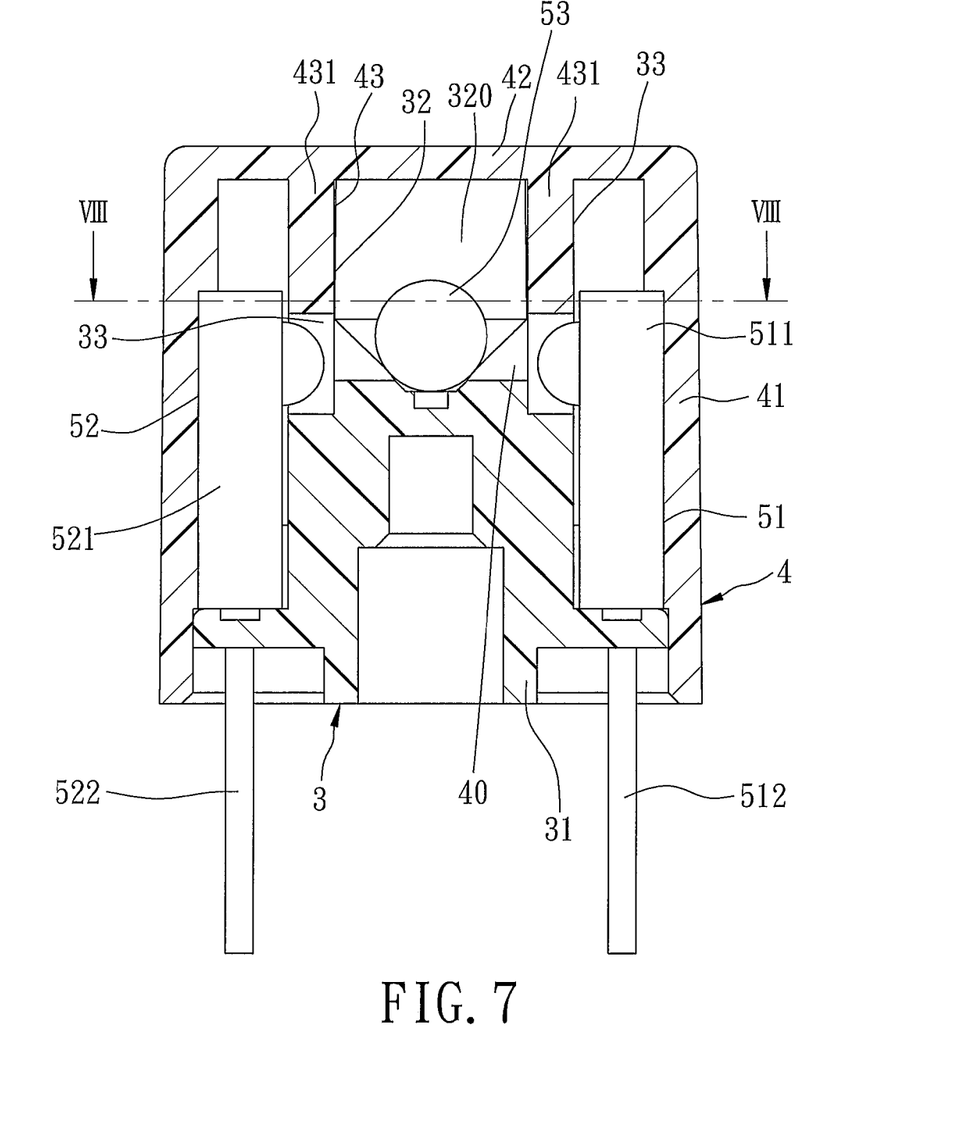
FIG. 7 is a sectional view of a photoelectric switch according to the second preferred embodiment of the present invention.
Figure 8:
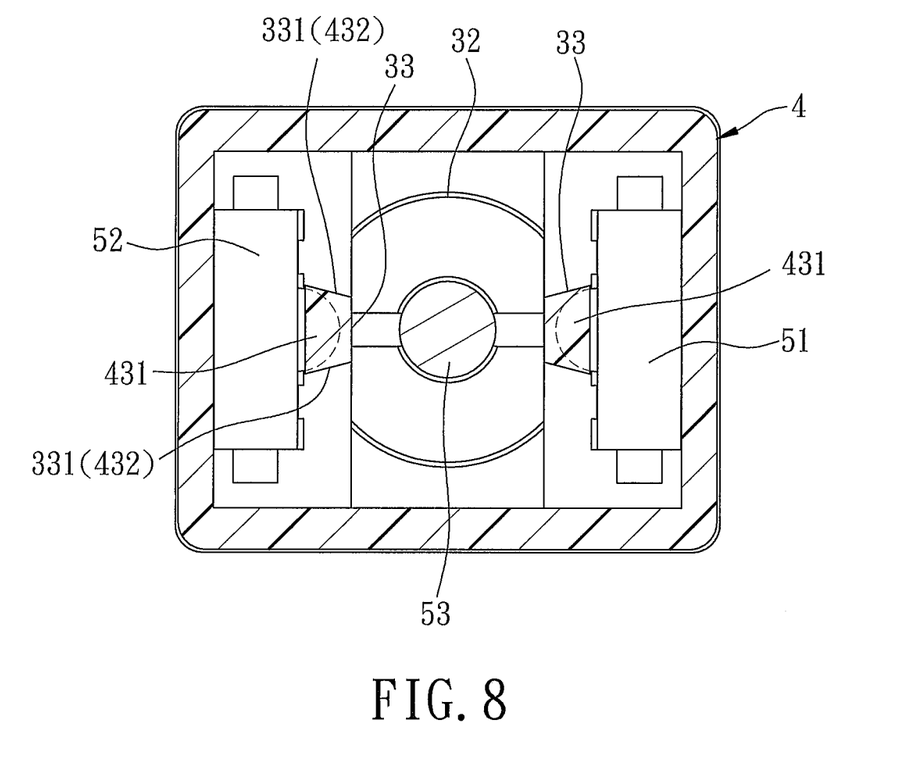
FIG. 8 is a sectional view of the second preferred embodiment taken along line VIII-VIII of FIG. 7.

Referring to FIGS. 7 and 8, a photoelectric switch according to the second preferred embodiment of the present invention is shown to be similar to the first preferred embodiment. However, in this embodiment, each of the first holes 33 is tapered and is defined by two inclined wall surfaces 331. Further, the cover 4 is dispensed with the second holes 44 shown in FIGS. 4 and 5, and the rib plates 431 of the rib unit 43 are fitted respectively into the first holes 33 so as to connect with the tubular wall 32. The rib plates 431 cooperate with the first holes 33 to define a portion of the light passage 40. Each rib plate 431 has two plate surfaces 432 abutting fittingly against the inclined wall surfaces 331 of the respective first hole 33. Similarly, light emitted by the light emitter 51 can be restricted to travel within the light passage 40.

Figure 9:
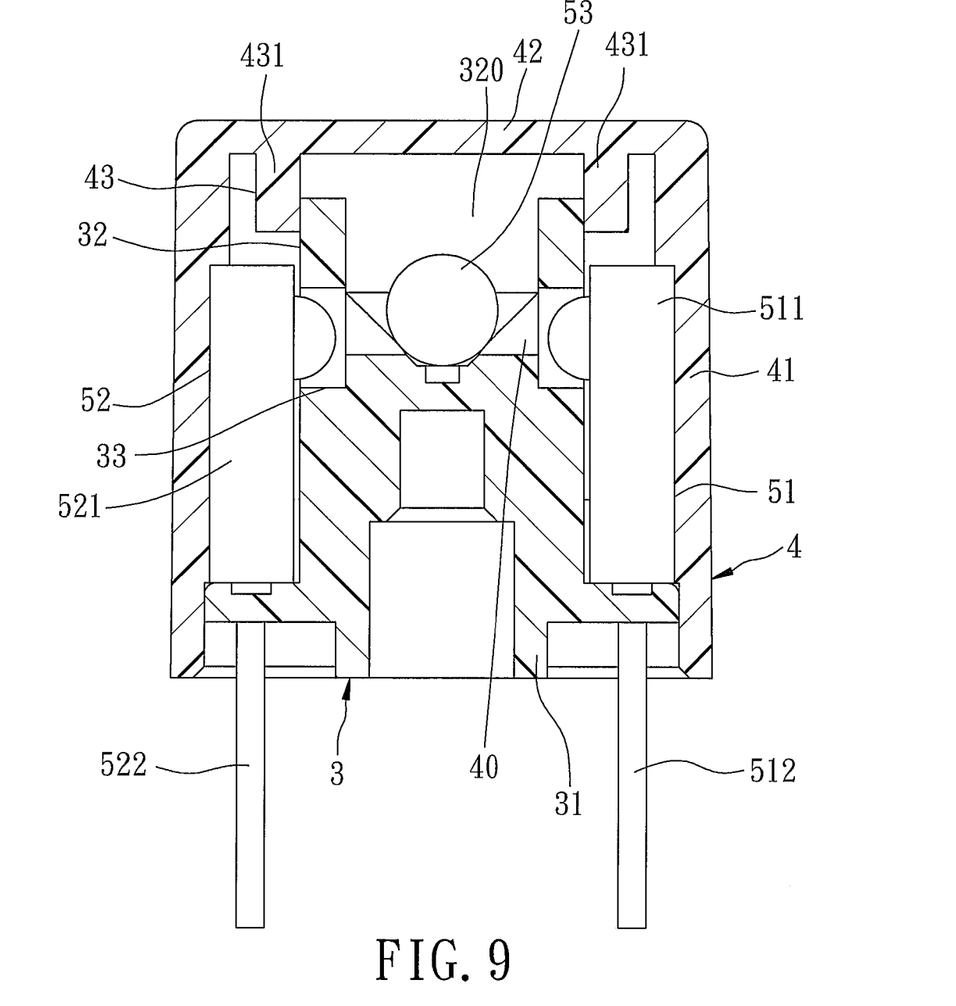
FIG. 9 is a sectional view of a photoelectric switch according to the third preferred embodiment of the present invention.

Referring to FIG. 9, a photoelectric switch according to the third preferred embodiment of the present invention is shown to be similar to the first preferred embodiment. However, in this embodiment, the first holes 33 are formed in the tubular wall 32 in proximity to the edges of the two diametrically opposite sides of the tubular wall 32, the cover 4 is dispensed with the second holes 44 shown in FIGS. 4 and 5, and the rib plates 431 of the rib unit 43 are overlapped with the two diametrically opposite sides of the tubular wall 32.

Figure 10:
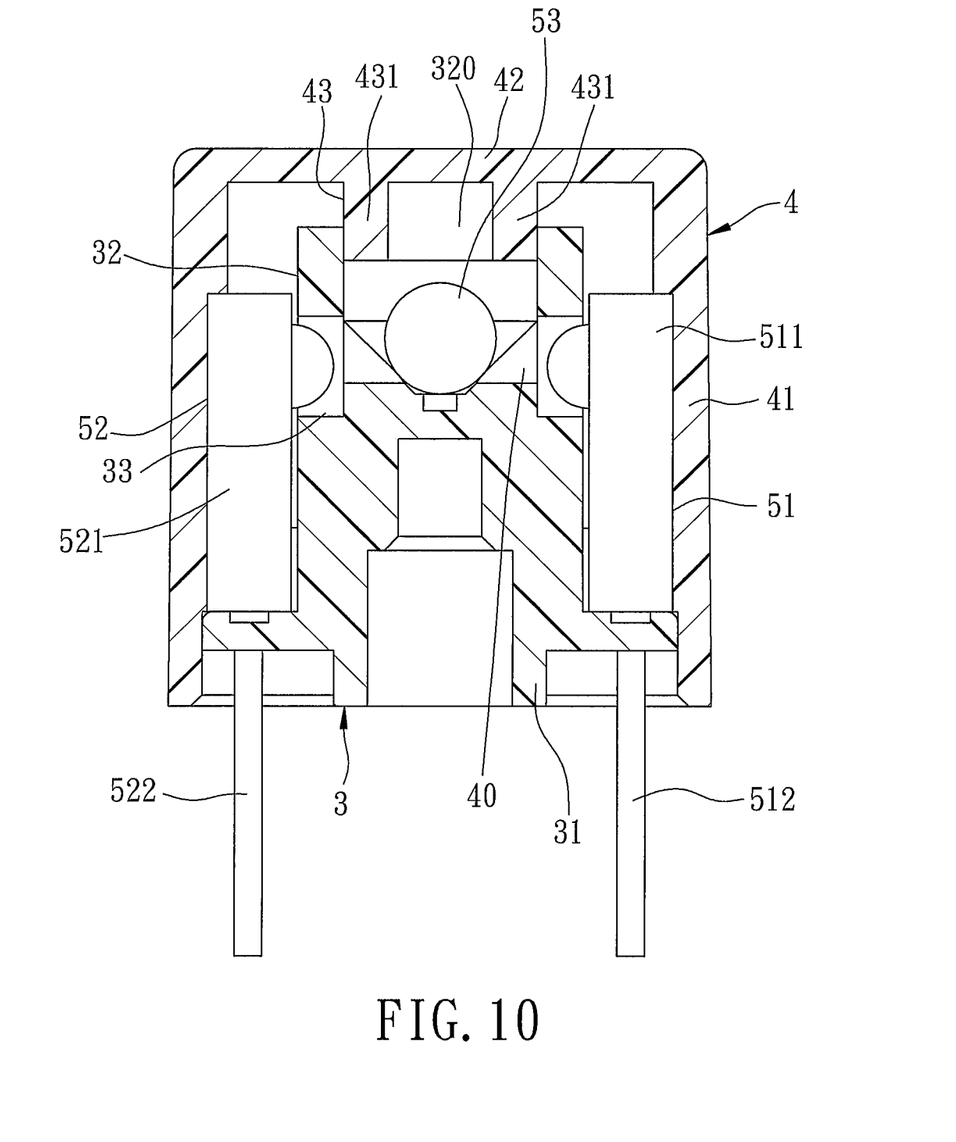
FIG. 10 is a sectional view of a photoelectric switch according to the fourth preferred embodiment of the present invention.

Referring to FIG. 10, a photoelectric switch according to the fourth preferred embodiment of the present invention is shown to be similar to the third preferred embodiment. However, in this embodiment, the rib plates 431 of the rib unit 43 extend into the tubular wall 32, and are overlapped with the two diametrically opposite sides of the tubular wall 32.

From the aforesaid description, the advantage and efficiency of the present invention reside in: Through the overlapping relationship of the tubular wall 32 and the rib plates 431 of the rib unit 43 to confine the light passage 40, a light transmission range is restricted within the light passage 40. Further, the present invention uses coupling relationship among the components to complete the assembly, and thus has no need for additional components. Hence, the components of the present invention are not only simplified, the convenience of assembly is also enhanced. Moreover, light leakage can be prevented to thereby enhance the sensitivity of the photoelectric switch of the present invention.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A photoelectric switch comprising:
   a base including a tubular wall surrounding an axis;
   a cover coupled to said base and including a rib unit that protrudes from an inner surface of said cover and that overlaps two diametrically opposite sides of said tubular wall, said rib unit cooperating with said tubular wall to confine a rolling chamber therebetween;
   a light passage extending through said rolling chamber and said two diametrically opposite sides of said tubular wall; and
   a photoelectric unit enclosed by said base and said cover and including a light emitter and a light receiver disposed respectively on two opposite ends of said light passage, and a rolling member disposed in said rolling chamber and movable between a blocking position to block said light passage and a non-blocking position to unblock said light passage.

2. The photoelectric switch as claimed in claim 1, wherein said base further includes two first holes that are formed respectively in said diametrically opposite sides of said tubular wall in communication with said rolling chamber and that are indented axially and respectively in edges of said diametrically opposite sides of said tubular wall.

3. The photoelectric switch as claimed in claim 2, wherein said cover further includes two second holes, said rib unit including two spaced-apart rib plates overlapping said diametrically opposite sides of said tubular wall, said second holes being indented axially and respectively in edges of said rib plates and being respectively aligned with said first holes in a direction transverse to said axis, said light passage extending through said aligned first and second holes and said rolling chamber.

4. The photoelectric switch as claimed in claim 2, wherein said rib unit includes two spaced-apart rib plates fitted respectively into said first holes to connect with said tubular wall and to cooperate with said first holes to define a portion of said light passage.

5. The photoelectric switch as claimed in claim 4, wherein each of said first holes is tapered and is defined by two inclined wall surfaces, each of said rib plates having two plate surfaces abutting fittingly against said inclined wall surfaces of a respective one of said first holes.

6. The photoelectric switch as claimed in claim 2, wherein said cover further includes a surrounding wall surrounding said axis, and an end wall connected to and closing one end of said surrounding wall and having said rib plates, said base further including a carrier connected to said tubular wall and closing another end of said surrounding wall, said carrier having two engaging grooves formed in two opposite sides thereof, said surrounding wall having two protrusions engaged respectively to said engaging grooves.

7. The photoelectric switch as claimed in claim 6, wherein each of said light emitter and said light receiver includes a main body disposed between said surrounding wall and one of said rib plates, a pair of terminals extending through said carrier, and a head extending into said light passage.

8. A photoelectric switch housing for mounting a photoelectric unit that emits and receives a light signal, said photoelectric switch housing comprising:
   a base including a tubular wall surrounding an axis;
   a cover coupled to said base, said cover and said base being adapted to cooperatively enclose therebetween the photoelectric unit, said cover including a rib unit that protrudes from an inner surface of said cover and that overlaps two diametrically opposite sides of said tubular wall, said rib unit cooperating with said tubular wall to confine a rolling chamber therebetween;
   a light passage extending through said rolling chamber and said two diametrically opposite sides of said tubular wall, said light passage being adapted to permit transmission of the light signal; and
   a rolling member disposed in said rolling chamber and being movable between a blocking position to block said light passage and a non-blocking position to unblock said light passage.

9. The photoelectric switch housing as claimed in claim 8, wherein said base further includes two first holes that are formed respectively in said diametrically opposite sides of said tubular wall in communication with said rolling chamber and that are indented axially and respectively in edges of said diametrically opposite sides of said tubular wall.

10. The photoelectric switch housing as claimed in claim 9, wherein said cover further includes two second holes, said rib unit including two spaced-apart rib plates overlapping said diametrically opposite sides of said tubular wall, said second holes being indented axially and respectively in edges of said rib plates and being respectively aligned with said first holes in a direction transverse to said axis, said light passage extending through said aligned first and second holes and said rolling chamber.

11. The photoelectric switch housing as claimed in claim 9, wherein said rib unit includes two spaced-apart rib plates fitted respectively into said first holes to connect with said tubular wall and to cooperate with said first holes to define a portion of said light passage.

12. The photoelectric switch housing as claimed in claim 9, further comprising two wing plates projecting from said base and connected respectively to said two diametrically opposite sides of said tubular wall, each of said wing plates projecting from said tubular wall substantially along a line that is tangent to a respective one of said diametrically opposite sides of said tubular wall at a respective one of said first holes.

* * * * *